US008012563B2

(12) United States Patent
Kusabiraki et al.

(10) Patent No.: US 8,012,563 B2
(45) Date of Patent: Sep. 6, 2011

(54) LARGE-SIZE SUBSTRATE

(75) Inventors: Daisuke Kusabiraki, Niigata-ken (JP); Yukio Shibano, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/891,028

(22) Filed: Jul. 15, 2004

(65) Prior Publication Data

US 2005/0013972 A1 Jan. 20, 2005

(30) Foreign Application Priority Data

Jul. 18, 2003 (JP) ................................. 2003-199004

(51) Int. Cl.
*B32B 1/00* (2006.01)

(52) U.S. Cl. .......... 428/141; 428/1.1; 428/192; 428/410; 451/41

(58) Field of Classification Search .................. 428/141, 428/1.1, 192, 410
See application file for complete search history.

(56) References Cited

U.S. PATENT DOCUMENTS

| 5,643,365 | A |   | 7/1997 | Blinov et al. |
| 5,773,126 | A | * | 6/1998 | Noritake et al. ............. 428/143 |
| 5,785,729 | A | * | 7/1998 | Yokokawa et al. ............. 65/385 |
| 5,816,897 | A |   | 10/1998 | Raeder et al. |
| 5,961,197 | A | * | 10/1999 | Watai et al. .................... 362/628 |
| 6,506,289 | B2 | * | 1/2003 | Demaray et al. .......... 204/192.26 |
| 6,910,953 | B2 | * | 6/2005 | Allaire et al. .................... 451/44 |
| 2002/0108400 | A1 | * | 8/2002 | Watanabe et al. ................. 65/61 |
| 2003/0031890 | A1 |   | 2/2003 | Moriya et al. |
| 2003/0143403 | A1 | * | 7/2003 | Shibano et al. ............... 428/410 |
| 2004/0248017 | A1 |   | 12/2004 | Ohtaguro et al. |

FOREIGN PATENT DOCUMENTS

| JP | 56-046227 A | 4/1981 |
| JP | 2-204345 A | 8/1990 |
| JP | 2000-267253 A | 9/2000 |
| JP | 2003-173015 A | 6/2003 |
| JP | 2005-300566 A | 10/2005 |

OTHER PUBLICATIONS

English language abstract of JP 2003-089550 (Mar. 28, 2003).

* cited by examiner

*Primary Examiner* — David Sample
*Assistant Examiner* — Laura Auer
(74) *Attorney, Agent, or Firm* — Birch, Stewart, Kolasch & Birch, LLP

(57) ABSTRACT

A large-size substrate adapted for light exposure is of a plate shape having a diagonal length or diameter of 500-2,000 mm, a thickness of 1-20 mm, and a peripheral surface with a roughness Ra of 0.05-0.4 μm. The number of particles released from the substrate periphery during cleaning is minimized, leading to an improved yield in the cleaning step. The substrate can be manually handled, achieving an improvement in substrate quality without a need for a handling mechanism.

10 Claims, 2 Drawing Sheets

LARGE-SIZE SUBSTRATE

This Nonprovisional application claims priority under 35 U.S.C. §119(a) on Patent Application No(s). 2003-199004 filed in Japan on Jul. 18, 2003, the entire contents of which are hereby incorporated by reference.

TECHNICAL FIELD

This invention relates to large-size substrates adapted for light exposure for use in the manufacture of liquid crystal (LC) panels.

BACKGROUND ART

In general, TFT liquid crystal panels utilize the active matrix addressing scheme in which liquid crystals are sealed between an array-side substrate having TFT devices built therein and a substrate having a color filter attached thereto, and voltages are controlled by the TFTs for controlling the alignment of liquid crystals.

For the manufacture of the array-side substrate, plural layers are repeatedly printed on a mother glass sheet of alkali-free glass by light exposure through original plates having circuitry pattern, known as large-size photomasks. The color filter-side substrate is similarly manufactured by a lithographic process, known as dye impregnation process.

For the manufacture of both array- and color filter-side substrates, large-size photomasks are necessary. To implement precision light exposure, synthetic quartz glass substrates having a low coefficient of linear expansion are often used for the large-size photomasks.

When the peripheral surface of a substrate is chamfered to any shape by means of a chamfering machine, dusting from the peripheral surface becomes one of factors that govern the surface state of a finished product, especially the presence or absence of contaminants on the surface. If the peripheral surface of the substrate is rough, the contaminants deposited on the peripheral surface cannot be removed by simple cleaning. Not only some contaminants migrate and deposit on the substrate major surfaces, which in turn, requires re-cleaning or re-polishing to remove those contaminants, leading to a drop of manufacture yield.

To solve the above and other problems, a method of mirror surface finishing the peripheral surface of a substrate of any shape is employed in the case of IC photomask substrates (see JP-A 56-46227). In the case of large-size substrates for LC, on the other hand, they are of varying sizes, which makes it difficult for a machine to handle substrates (because defects are formed on the surface if a machine component comes in contact with the surface). It is thus a common practice to manually hold the substrate by clamping at the peripheral surfaces by hands. A mirror finish if administered on the peripheral surface of a large-size substrate as in the case of IC photomask substrates, combined with the substantial weight of the large-size substrate, often causes slippage to occur between the handling gloves and the substrate, resulting in a failure to hold the substrate.

It would be desirable to have a large-size substrate which generates a minimum amount of dust during cleaning and allows manual handling.

SUMMARY OF THE INVENTION

An object of the present invention is to provide a large-size substrate adapted for light exposure which generates a minimum amount of dust from its peripheral surface during cleaning and allows manual handling.

For a large-size substrate to be manually held at its peripheral surface in a wet state, it has been found that if the peripheral surface of the substrate is provided with a level of roughness to prevent the substrate from being slipped away from the handling gloves, this not only ensures safe manual holding of the substrate, but also suppresses dust generation from the peripheral surface.

The present invention provides a large-size substrate adapted for light exposure, which is of a plate shape having a diagonal length or diameter of at least 500 mm, a thickness of 1 to 20 mm, and a peripheral surface with a roughness Ra in the range of 0.05 to 0.4 μm.

Preferably the peripheral surface of the substrate has a coefficient of static friction with a handling glove in the presence of water of [substrate weight (kg)]/2×(0.02 to 0.03), typically in the range of 0.1 to 0.2. Most often, the substrate is of synthetic quartz.

BRIEF DESCRIPTION OF THE DIAGRAMS

DESCRIPTION OF THE PREFERRED EMBODIMENTS

Figure 1:
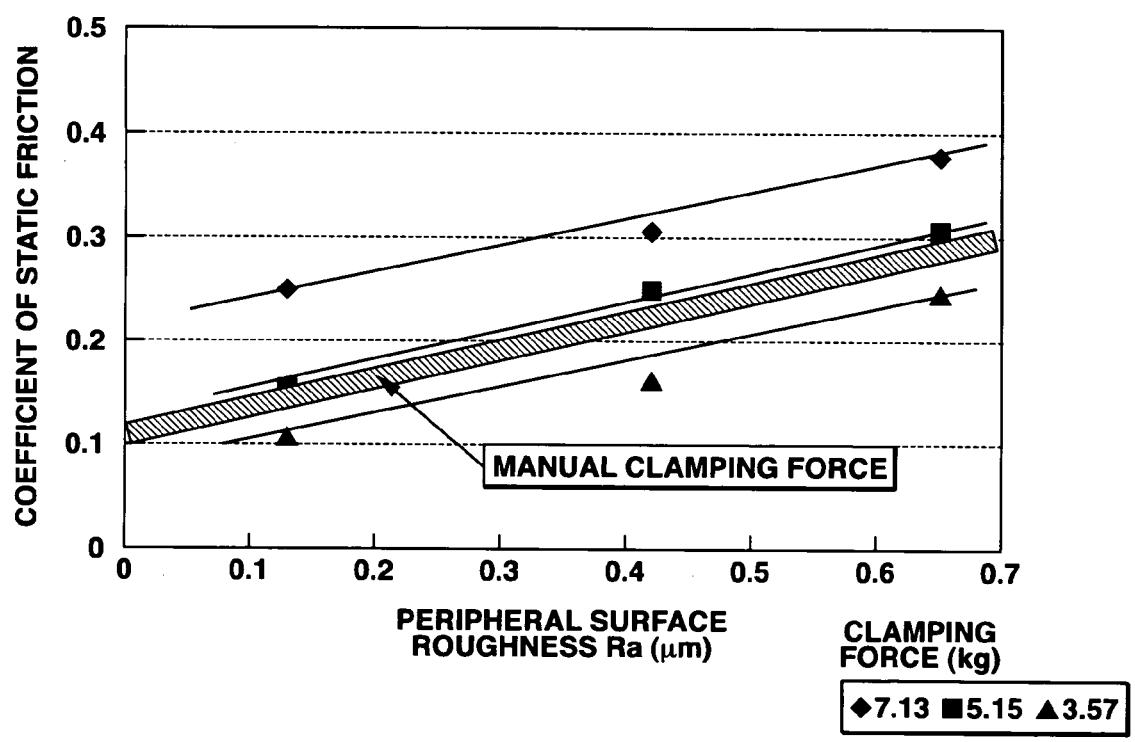
FIG. 1 is a graph showing a coefficient of static friction versus a peripheral surface roughness at different clamping forces.

The large-size substrate of the invention has a plate shape and is embodied as a large-size synthetic quartz glass substrate, suitable as a photomask substrate and a TFT liquid crystal array-side substrate. The substrate is sized to have a diagonal length or diameter of at least 500 mm, preferably 500 to 2,000 mm. The planar shape of the substrate may be square, rectangular, circular or analogous. The substrate has a thickness of 1 to 20 mm, preferably 5 to 12 mm. The substrate has a pair of major surfaces and a peripheral or side surface(s) therebetween. The peripheral surface may be of any shape, although the manual holding at the peripheral surface favors a substrate in the form of a quadrangular plate, more preferably a rectangular plate, defining linear side surfaces.

In the large-size substrate for light exposure according to the invention, the peripheral or side surface has an average surface roughness Ra in the range of 0.05 to 0.4 μm, preferably 0.05 to 0.3 μm. A peripheral surface with a Ra of less than 0.05 μm is too slippery and difficult to handle. A peripheral surface with a Ra of more than 0.4 μm can be manually handled, but releases a more amount of dust or particles with which the substrate surface can be contaminated.

The above-described large-size substrate for light exposure is manufactured by first chamfering the periphery of a starting large-size substrate. Chamfering is generally conducted by diamond grinding, desirably using diamond abrasives having a size of #600 to #1500.

After chamfering to any desired shape, the substrate is lapped and the peripheral surface is then worked or finished so as to improve the surface roughness. The peripheral finishing is conducted, for example, by brushing all the periphery of the substrate by means of a peripheral quasi-mirror finishing tool. Specifically, a nylon brush is rotated and the periphery of the substrate is traversed as desired. Thereafter, final polishing is conducted on the substrate major surfaces. It is noted that the peripheral finishing is typically done after the lapping step, but may be done at any other stage.

Preferably the following considerations are taken. In the step of cleaning the substrate subsequent to the quasi-mirror finishing of its periphery, the substrate in a wet state is manipulated while clamping it only at the peripheral surfaces with human hands. The peripheral surfaces in a wet state are more slippery. The worker puts on special gloves known as handling gloves. In manipulating the substrate in a dry or wet state while holding only the peripheral surfaces with the gloved hands, the substrate can be slipped away from the gloved hands depending on the roughness of the peripheral surfaces, particularly when the roughness is approximate to a mirror finish. Handling operation is then impossible.

If the relationship of the roughness of the substrate peripheral surface to the handling by gloved hands is determined, it becomes possible to produce an appropriate peripheral surface state to enable manual handling operation by controlling the roughness of the substrate peripheral surface by means of a peripheral quasi-mirror finishing tool. That peripheral surface state is also a level sufficient to prevent dusting from the substrate periphery.

To determine a level of roughness of the peripheral surfaces that permits the worker to hold the wet substrate only at the peripheral surfaces with gloved hands, the inventor explored the relationship of the weight of the substrate to the level of roughness of substrate peripheral surfaces below which the wet substrate at the peripheral surfaces cannot be held with gloved hands, with the results plotted in the diagram of FIG. 1. More particularly, a substrate having a given weight and a given roughness Ra on its peripheral surfaces was furnished. In a wet state (in the presence of water), the substrate was mounted between a pair of springs, with gloves interposed between the substrate peripheral surfaces and the springs. A certain force was applied across the opposite ends of the springs to clamp the substrate therebetween. The substrate in this state is lifted upward. The lifting force applied when the substrate started slipping was measured by a spring type tension gauge. A ratio of the lifting force to the clamping force is computed as a coefficient of static friction. It is noted that the manual clamping force in FIG. 1 is in a range of 4.5 to 5.0 kg. The surface roughness (Ra) was measured by a probe type surface roughness meter.

It is seen from the plots in FIG. 1 that the level of surface roughness of the substrate periphery to enable handling operation is determined substantially to a fixed value that depends solely on the substrate weight. Putting these relationships in order reveals that the coefficient of static friction of a substrate at its peripheral surface is equal to [substrate weight]/2×(0.02 to 0.03). It is understood that once the weight of any substrate is known, a value for surface roughness of the substrate periphery to enable manual handling operation can be estimated from the diagram of FIG. 1.

As long as the surface roughness of the substrate periphery is equal to or above the thus determined value, the substrate can be handled with gloved hands independent of whether the substrate is dry or wet. For holding the substrate at its peripheral surfaces in a wet state, the value for coefficient of static friction is more predominantly governed by the surface roughness of the substrate periphery than the type of handling gloves.

As long as the periphery of a substrate is worked to a controlled surface roughness, any substrate can be manually handled and dusting from the peripheral surface can be suppressed.

Figure 2:
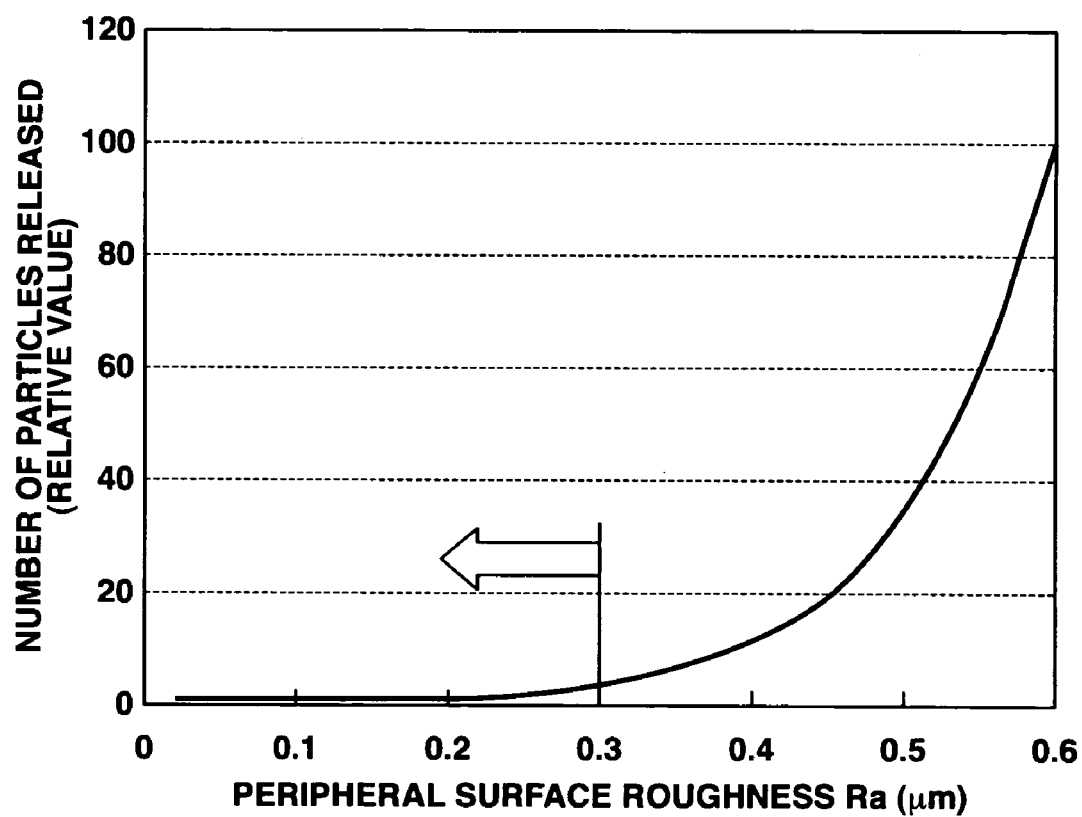
FIG. 2 is a graph showing the number of particles released versus a peripheral surface roughness.

With respect to particles that generate from the substrate peripheral surface during cleaning, a substrate dimensioned 520 mm×800 mm×10 mm (thick) was immersed in a Pyrex® tank together with a substrate holder, ultrasonic waves at 36 kHz and 200 W were applied for 10 minutes, and the number of particles released was counted by a particle counter. The results are plotted in FIG. 2. The number of particles released is plotted on the ordinate as a relative value based on 100 for a peripheral surface roughness of 0.6 μm. The number of particles released increases with increasing surface roughness of the periphery and decreases with a smoother surface. Particle release is substantially suppressed by setting Ra to 0.3 μm or below. It is noted that the number of particles released from the substrate holder is subtracted from the overall number of particles.

EXAMPLE

Examples and Comparative Examples are given below for illustrating the invention, but the invention is not limited thereto.

Example 1

A rectangular synthetic quartz substrate of dimensions 520 mm×800 mm×10.0 mm (thick) having a weight of 9.2 kg was chamfered by a chamfering machine using #1200 diamond grits, furnishing a starting substrate. Lapping and primary polishing were carried out before the peripheral surfaces were worked. The roughness of the peripheral surfaces was measured by a probe type roughness meter, finding Ra=0.05 μm.

The major surfaces of the substrate were subjected to final polishing and then cleaned. In the cleaning step, the substrate was handled with gloved hands, confirming possible manual manipulation. An estimated coefficient of static friction was 0.12. The gloves used were made of polyvinyl chloride and polyethylene. The substrate could be equally handled in either a dry or a wet state. The substrate as cleaned had a satisfactory degree of cleanness, indicating few particles released.

Example 2

A rectangular synthetic quartz substrate of dimensions 700 mm×800 mm×8.0 mm (thick) having a weight of 9.9 kg was chamfered by a chamfering machine using #800 diamond grits, furnishing a starting substrate. The substrate was then worked as in Example 1, reaching a roughness Ra=0.09 μm on the peripheral surfaces. As in Example 1, the substrate was handled for cleaning, finding equivalent results. An estimated coefficient of static friction was 0.13.

Example 3

A rectangular synthetic quartz substrate of dimensions 800 mm×920 mm×10.0 mm (thick) having a weight of 13.0 kg was chamfered by a chamfering machine using #1200 diamond grits, furnishing a starting substrate. The substrate was then worked as in Example 1, reaching a roughness Ra=0.16 μm on the peripheral surfaces. As in Example 1, the substrate was handled for cleaning, finding equivalent results. An estimated coefficient of static friction was 0.16.

Comparative Example

No Working on Peripheral Surfaces

A rectangular synthetic quartz substrate of dimensions 700 mm×800 mm×8.0 mm (thick) having a weight of 9.9 kg was chamfered by a chamfering machine using #800 diamond grits, furnishing a starting substrate. Lapping and primary polishing were carried out, but the subsequent peripheral surface working was omitted. The roughness of the peripheral surfaces was measured by a probe type roughness meter, finding Ra=0.5 μm.

The major surfaces of the substrate were subjected to final polishing and then cleaned. In the cleaning step, the substrate was handled with gloved hands, confirming possible manual manipulation. An estimated coefficient of static friction was 0.24. The gloves used were made of polyvinyl chloride. The substrate could be equally handled in either a dry or a wet state. The substrate as cleaned had an unsatisfactory degree of cleanness, indicating many particles released.

The large-size substrate for light exposure of the invention has the advantage that the number of particles released from the substrate periphery during cleaning is minimized, leading to an improved yield in the cleaning step. The substrate can be manually handled, achieving an improvement in substrate quality without a need for a handling mechanism.

Japanese Patent Application No. 2003-199004 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A large-size synthetic quartz substrate adapted for light exposure, the substrate being a rectangular plate shape and having a diagonal length of at least 500 mm, and a uniform thickness of 1 to 20 mm, and the periphery of the substrate being chamfered, wherein
   each of side surfaces of the substrate has rectangular shape,
   each of the side surfaces has a roughness of Ra in the range of 0.05 to 0.4 μm,
   each of the side surfaces has a coefficient of static friction with a handling glove in the presence of water of (substrate weight (kg))/2×(0.02 to 0.03), and
   the large-size synthetic quartz substrate is a photomask substrate.

2. The substrate of claim 1, wherein each of the side surfaces of the substrate has a coefficient of static friction with a handling glove in the presence of water of 0.1 to 0.2.

3. The substrate of claim 1, wherein the substrate has a diagonal length of 500 to 2,000 mm, a thickness of 5 to 12 mm, and side surfaces with a roughness Ra in the range of 0.05 to 0.3 μm.

4. A method for producing a large-size synthetic quartz substrate adapted for light exposure, comprising the steps of:
   providing a substrate being a rectangular plate shape and having a diagonal length of at least 500 mm, a uniform thickness of 1 to 20 mm, the peripheral of the substrate being chamfered; and
   diamond-grinding a side surface of the substrate so that the side surface has a roughness of Ra in the range of 0.05 to 0.4 μm and the side surface of the substrate has a coefficient of static friction with a handling glove in the presence of water of (substrate weight (kg))/2×(0.02 to 0.03).

5. A method for handling a large-size synthetic quartz substrate adapted for light exposure, comprising the steps of:
   providing a large-size synthetic quartz substrate adapted for light exposure, the substrate being a rectangular plate shape and having a diagonal length of at least 500 mm, a uniform thickness of 1 to 20 mm, and a side surface with a roughness of Ra in the range of 0.05 to 0.4 μm, the peripheral of the substrate being chamfered; and
   handling the substrate with a handling glove in the presence of water, the side surface of the substrate having a coefficient of static friction with the handling glove in the presence of water of (substrate weight (kg))/2×(0.02 to 0.03).

6. The method of claim 4, wherein the side surface of the substrate has a coefficient of static friction with a handling glove in the presence of water of 0.1 to 0.2.

7. The method of claim 5, wherein the side surface of the substrate has a coefficient of static friction with a handling glove in the presence of water of 0.1 to 0.2.

8. The method of claim 4, wherein the substrate has a diagonal length of 500 to 2,000 mm, a thickness of 5 to 12 mm, and a side surface with a roughness Ra in the range of 0.05 to 0.3 μm.

9. The method of claim 5, wherein the substrate has a diagonal length of 500 to 2,000 mm, a thickness of 5 to 12 mm, and a side surface with a roughness of Ra in the range of 0.05 to 0.3 μm.

10. The substrate of claim 1, wherein only the side surfaces have a roughness of Ra in the range of 0.05 to 0.4 μm.

* * * * *